(12) United States Patent
Steinhoff

(10) Patent No.: US 11,948,878 B2
(45) Date of Patent: Apr. 2, 2024

(54) SEMICONDUCTOR CHIP PACKAGE AND METHOD OF ASSEMBLY

(71) Applicant: Littelfuse, Inc., Chicago, IL (US)

(72) Inventor: Stefan Steinhoff, Somerset (GB)

(73) Assignee: LITTELFUSE, INC., Chicago, IL (US)

( * ) Notice: Subject to any disclaimer, the term of this patent is extended or adjusted under 35 U.S.C. 154(b) by 42 days.

(21) Appl. No.: 17/940,125

(22) Filed: Sep. 8, 2022

(65) Prior Publication Data

US 2023/0032658 A1 Feb. 2, 2023

Related U.S. Application Data

(62) Division of application No. 17/160,917, filed on Jan. 28, 2021, now Pat. No. 11,488,903.

(60) Provisional application No. 62/966,951, filed on Jan. 28, 2020.

(51) Int. Cl.
*H01L 25/00* (2006.01)
*H01L 21/48* (2006.01)
*H01L 23/498* (2006.01)
*H01L 25/065* (2023.01)

(52) U.S. Cl.
CPC .... *H01L 23/49833* (2013.01); *H01L 21/4875* (2013.01); *H01L 23/49894* (2013.01); *H01L 25/0655* (2013.01); *H01L 25/50* (2013.01)

(58) Field of Classification Search
CPC .......... H01L 23/49833; H01L 21/4875; H01L 25/50; H01L 25/0655; H01L 24/48; H01L 24/73
See application file for complete search history.

(56) References Cited

U.S. PATENT DOCUMENTS

| | | | |
|---|---|---|---|
| 5,045,922 A | 9/1991 | Kodama | |
| 5,610,439 A | 3/1997 | Hiyoshi | |
| 9,412,679 B1 | 8/2016 | Nakahara et al. | |
| 9,728,453 B2 * | 8/2017 | Tseng | H01L 21/76895 |

(Continued)

FOREIGN PATENT DOCUMENTS

| | | |
|---|---|---|
| DE | 112012006007 T5 | 11/2014 |
| EP | 2840607 A1 | 2/2015 |

OTHER PUBLICATIONS

European Search Report and Written Opinion for the European Application No. EP21748178, dated Jun. 20, 2023, 10 pages.

*Primary Examiner* — Thao P Le
(74) *Attorney, Agent, or Firm* — KDW Firm PLLC

(57) ABSTRACT

A semiconductor device substrate assembly may include a first substrate, comprising: a first insulator plate; and a first patterned metal layer, disposed on the first insulator plate, wherein the first insulator plate comprises a first material and a first thickness. The assembly may include a second substrate, comprising: a second insulator plate; and a second patterned metal layer, disposed on the second insulator plate, wherein the second insulator plate comprises the first material and the first thickness. The assembly may also include a third substrate, disposed between the first substrate and the second substrate, comprising: a third insulator plate; and a third patterned metal layer, disposed on the third insulator plate, wherein the third insulator plate comprises a second material and a second thickness, wherein at least one of the second material and the second thickness differs from the first material and the first thickness, respectively.

16 Claims, 5 Drawing Sheets

(56) References Cited

U.S. PATENT DOCUMENTS

| | | | |
|---|---|---|---|
| 2006/0001140 A1 | 1/2006 | Lee et al. | |
| 2009/0001503 A1* | 1/2009 | Oh | H01L 29/7841 |
| | | | 257/506 |
| 2011/0057713 A1 | 3/2011 | Kawanami et al. | |
| 2011/0168434 A1* | 7/2011 | Farooq | H01L 21/2007 |
| | | | 174/257 |
| 2011/0254177 A1 | 10/2011 | Malhan et al. | |
| 2012/0025389 A1* | 2/2012 | Chu | B81C 1/00269 |
| | | | 257/773 |
| 2013/0200510 A1 | 8/2013 | Soyano | |
| 2016/0197014 A1* | 7/2016 | Yu | H01L 21/76898 |
| | | | 438/653 |
| 2016/0233203 A1* | 8/2016 | Chen | H01L 21/4846 |
| 2019/0067151 A1 | 2/2019 | Chen et al. | |
| 2019/0198424 A1 | 6/2019 | Lam et al. | |
| 2021/0118781 A1 | 4/2021 | Hasegawa et al. | |
| 2021/0233838 A1* | 7/2021 | Steinhoff | H01L 23/49894 |
| 2021/0296269 A1 | 9/2021 | Sharangpani et al. | |
| 2021/0398881 A1 | 12/2021 | Hatano | |

* cited by examiner

SEMICONDUCTOR CHIP PACKAGE AND METHOD OF ASSEMBLY

RELATED APPLICATIONS

This application is a divisional application of U.S. patent application Ser. No. 17/160,917 filed Jan. 28, 2021, entitled Semiconductor Chip Package and Method of Assembly, which claims priority to U.S. Provisional patent application 62/966,951, filed Jan. 28, 2020, entitled Semiconductor Chip Package and Method of Assembly, and incorporated by reference herein in its entirety.

BACKGROUND

Field

Embodiments relate to the field of semiconductor devices, and in particular, packages for power semiconductor chips.

Discussion of Related Art

Present day power semiconductor modules, including insulated gate bipolar transistors (IGBT) or diode power modules (e.g. 3.3 kV, 4.5 kV or 6.5 kV; 1500 A or 1200 A) may include multiple substrates, such as 2, 4 or 6 substrates, similar to each other. Each substrate, with wires and resistors, hold the IGBT and diode chips as well as busbars, where the busbars serve as the electrical power connection to the power semiconductor module. In turn, the substrates may be affixed to a baseplate, to form an assembly of substrates arrayed on a common support structure, such as Aluminum Silicon Carbide.

A power semiconductor substrate may include a sandwich of two metal sheets (e.g. Cu or Al), one of them patterned into a patterned metal layer, and bonded to a ceramic disposed between the patterned metal sheets. The substrates, e.g., $Al_2O_3$, AlN or $Si_3N_4$), are chosen carefully, taking various requirements into account, including: 1.) High electrical isolation of the top side to the base is needed (typically either min. 6 kV or 10.2 kV for high power modules); 2.) high vertical thermal conductivity is needed, especially underneath the semiconductor chips, for best possible cooling; 3.) Reliable mechanical stability during manufacturing, assembly and in operation is needed, especially during the busbar attachment process, for example, being more robust against mechanical stress of a busbar attachment process; 4.) high lateral conductivity of the top metal layer is needed for minimal electrical resistances and consequential conduction losses, as well as good lateral heat dissipation; 5.) A full electrical test of the substrates before assembly is needed in order to ensure good manufacturing yield and device quality; 6.) Costs for materials, process and scrap need to be kept reasonably low; and 7.) the designs have to be symmetrical in a way that ensures symmetrical impedance for each set of chips.

Typical methods to attach the busbars (typically made from Ni plated Cu or pure Cu) to the substrates include soldering, ultrasonic welding or laser welding or Ag sintering. In the case of soldering, the joint on its own may not be sufficiently strong mechanically. As a consequence, additional efforts are taken to hold the busbars in place (e.g., potting the module with epoxy). This approach does not just entail an additional process step, but leads to further issues in long term reliability and additional weight. The more recently developed ultrasonic welding or laser welding may provide very strong connections that don't require subsequent epoxy potting. Use of these later processes are therefore desirable in principle. Several issues remain before successful implementation of a robust welding process, including particle generation during the welding process, a limited process window due to the danger of damaging the ceramic substrates, and limited accessibility for the welding tools.

In view of the above, the present embodiments are provided.

SUMMARY

Semiconductor device substrate assemblies and packages are disclosed, as well as related methods. In one embodiment, a semiconductor device substrate assembly may include a first substrate, comprising: a first insulator plate; and a first patterned metal layer, disposed on the first insulator plate, wherein the first insulator plate comprises a first material and a first thickness. The semiconductor device substrate assembly may include a second substrate, comprising: a second insulator plate; and a second patterned metal layer, disposed on the second insulator plate, wherein the second insulator plate comprises the first material and the first thickness. The semiconductor device substrate assembly may also include a third substrate, disposed between the first substrate and the second substrate, comprising: a third insulator plate; and a third patterned metal layer, disposed on the third insulator plate, wherein the third insulator plate comprises a second material and a second thickness, wherein at least one of the second material and the second thickness differs from the first material and the first thickness, respectively.

In another embodiment, a semiconductor device package, may include a first substrate, where the first substrate includes a first insulator plate; and a first patterned metal layer, disposed on the first insulator plate; and a first set of semiconductor die, disposed on the first patterned metal layer. The semiconductor device package may include a second substrate, including a second insulator plate; a second patterned metal layer, disposed on the second insulator plate; and a second set of semiconductor die, disposed on the second patterned metal layer. The semiconductor device package may include a third substrate, disposed between the first substrate and the second substrate, where the third substrate includes a third insulator plate; and a third patterned metal layer, disposed on the third insulator plate; and a set of busbars, connected to the third patterned metal layer.

In a further embodiment, a method of forming a semiconductor package is provided. The method may include affixing a first substrate on a baseplate, the first substrate comprising a first insulator material, and a first patterned metal layer. The method may include affixing a second substrate on the baseplate, the second substrate comprising the first insulator material and a second patterned metal layer, and affixing, between the first substrate and the second substrate, a third substrate on the baseplate, the third substrate comprising a second insulator material different from the first material, and further comprising a third patterned metal layer.

DESCRIPTION OF EMBODIMENTS

Figure 1A:
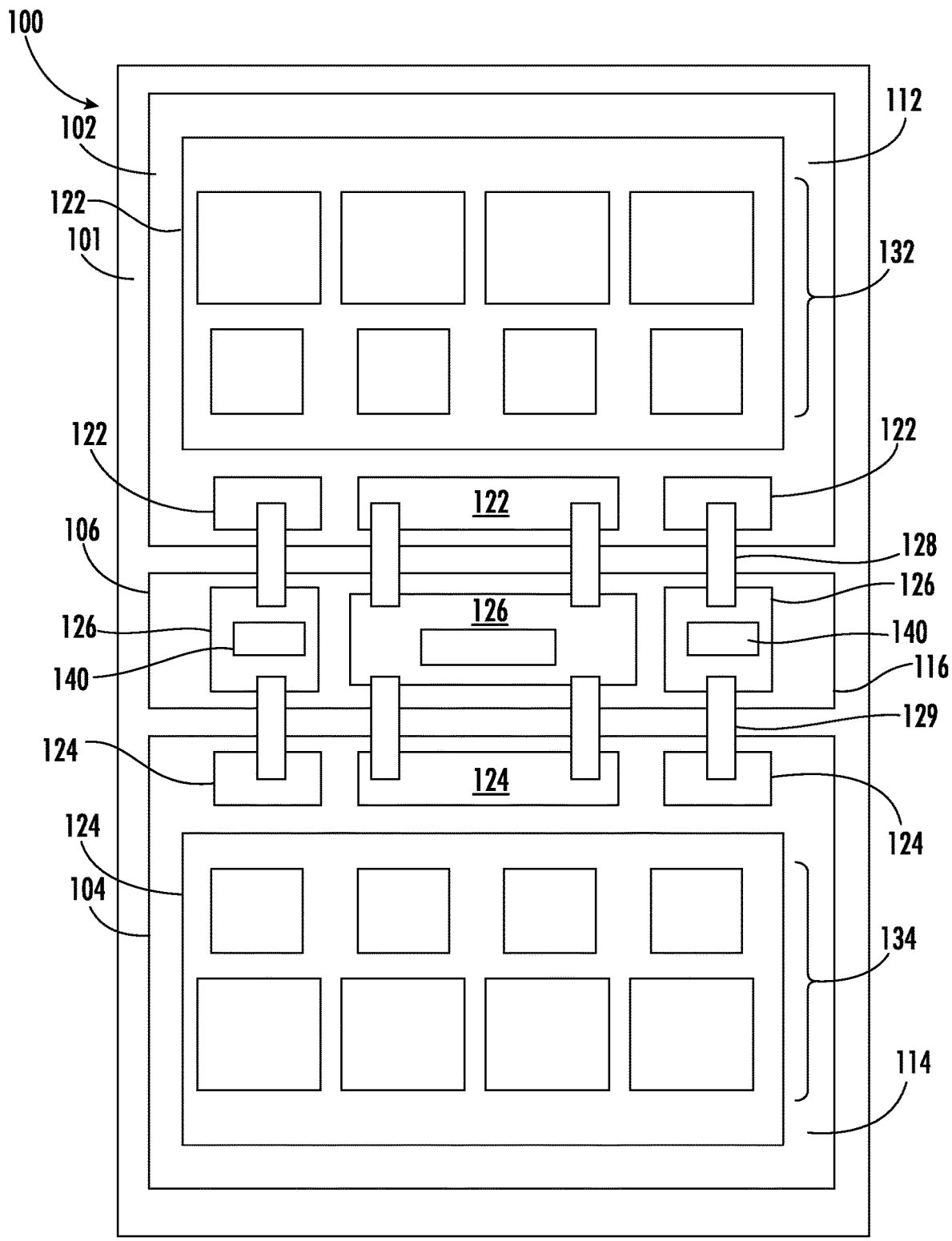
FIG. 1A shows a semiconductor device package in top plan view, in accordance with various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a semiconductor device package and techniques for assembly are provided for power semiconductor devices.

Figure 1B:
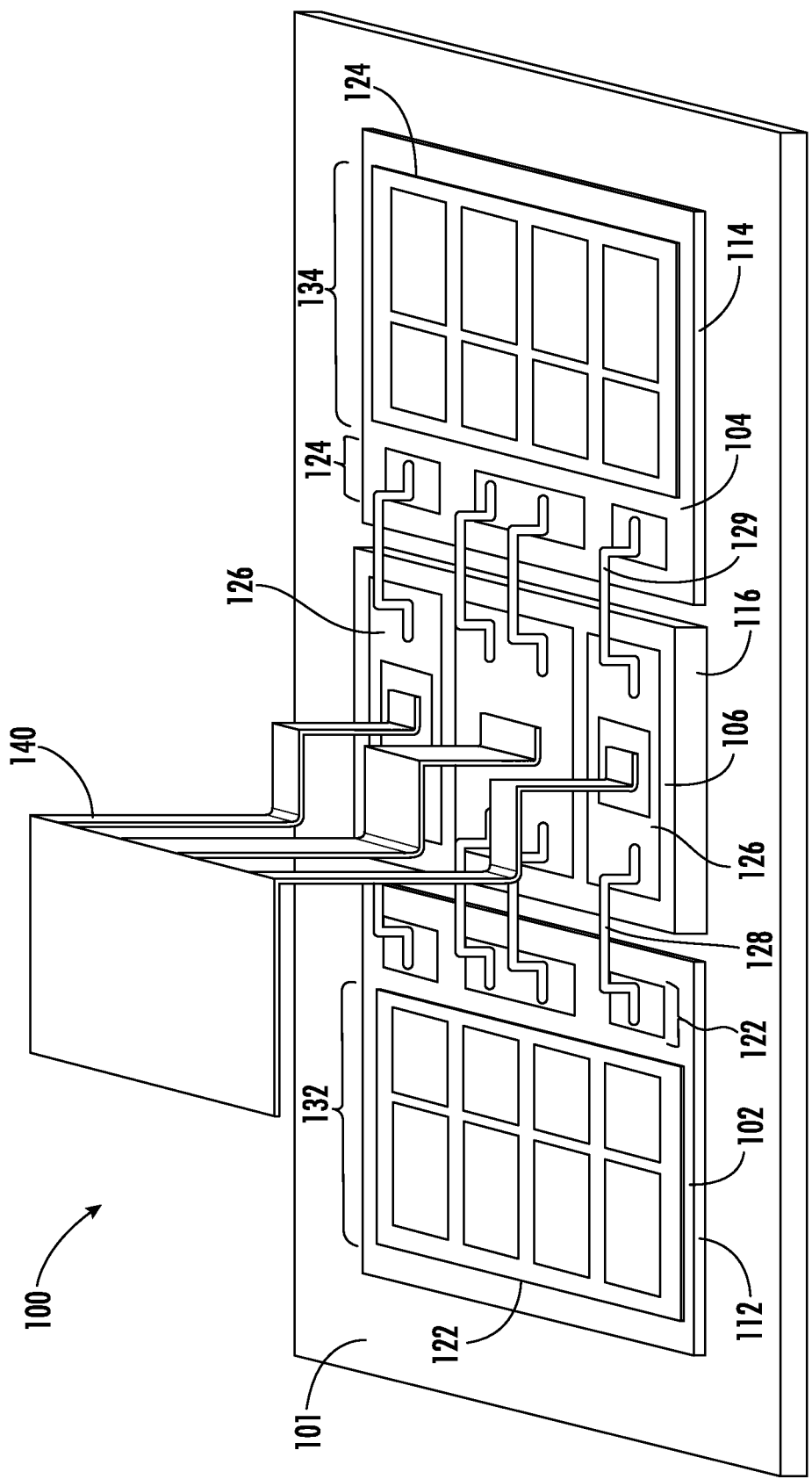
FIG. 1B illustrates a top perspective view of the semiconductor device package of FIG. 1A.

Turning to FIG. 1A there is shown a top plan view of a semiconductor device package 100, according to various embodiments of the disclosure. FIG. 1B shows a top perspective view of a variant of the semiconductor device package 100. The semiconductor device package 100 a first substrate 102, a second substrate 104 and third substrate 106, arranged on a baseplate 101. The baseplate 101 may be a known material for power semiconductor device packaging, including ceramic materials, such as aluminum silicon carbide. The embodiments are not limited in this context. In the configuration of FIG. 1, according to some embodiments, the first substrate 102 and second substrate 104 may be similar or the same, in that the materials, components, architecture, and dimensions are the same or similar. The third substrate 106 may differ substantially from the first substrate 102 and second substrate 104, as described below.

As an example, the first substrate 102 may include a first insulator plate 112 and a first patterned metal layer 122, disposed on the first insulator plate 112. In various non-limiting embodiments, the first insulator plate 112 may be formed of a known ceramic material, such as aluminum oxide, silicon nitride, or aluminum nitride. In certain embodiments, the first insulator plate 112 may be formed of aluminum nitride, silicon nitride or similar, having a thickness such as 1 mm, 0.6 mm, or similar thickness. As such, the first insulator plate 112 may provide a highly thermally conductive path to the baseplate 101. The first patterned metal layer 122 may be patterned into different regions, as shown. Notably, the patterned metal layer may be formed from a thin sheet, such as copper sheet. While not shown, the first substrate 102 may include a metal sheet on the opposite side as the side supporting the first patterned metal layer 122, thus forming a stack of insulator plate sandwiched between two metal sheets, as in known device packages.

The semiconductor device package 100 may include a first set of semiconductor die, shown as semiconductor die 132, disposed on the first patterned metal layer 122. The semiconductor die 132 may represent a set of power devices, including diodes, IGBTs, and so forth.

Similarly to the first substrate 102, the second substrate 104 may include a second insulator plate 114 and a second patterned metal layer 124, disposed on the second insulator plate 114. In various non-limiting embodiments, the second insulator plate 114 may be formed of a known ceramic material, such as aluminum oxide, silicon nitride, or aluminum nitride. In certain embodiments, the second insulator plate 114 may be formed of aluminum nitride having a thickness such as 1 mm, 0.5 mm, or similar thickness. As such, the second insulator plate 114 may provide a highly thermally conductive path to the baseplate 101. The second patterned metal layer 124 may be patterned into different regions, as shown. Notably, the second patterned metal layer 124 may be formed from a thin sheet, such as copper sheet. While not shown, the second substrate 104 may include a metal sheet on the opposite side as the side supporting the second patterned metal layer 124, thus forming a stack of insulator plate sandwiched between two metal sheets, as in known device packages.

Likewise, the semiconductor device package 100 may include a second set of semiconductor die, shown as semiconductor die 134, disposed on the second patterned metal layer 124. The semiconductor die 134 may represent a set of power devices, including diodes, IGBTs, and so forth.

As in known power semiconductor device packages, the first substrate 102 and second substrate 104 may be configured the same, including the thickness of the first insulator plate 112 and second insulator plate 114. However the thickness of the second insulator plate 114 need not match the thickness of the first insulator plate in some embodiments. In embodiments where the semiconductor die 132 and semiconductor die 134 are power semiconductor chips, to generate large currents, the first insulator plate 112 and second insulator plate 114 may be designed for dissipation of excessive heat, where high thermal conductivity and low thickness are desirable. Accordingly, in particular embodiments, the first insulator plate 112 and second insulator plate 114 may each be formed of aluminum nitride, silicon nitride or similar material, having a thickness such as 1 mm, such as 0.6 mm, or other suitable thicknesses.

As depicted in FIG. 1A and FIG. 1B the semiconductor device package 100 may also include a third substrate 106, disposed between the first substrate 102 and the second substrate 104. The third substrate 106 may include a third insulator plate 116, and a third patterned metal layer 126, disposed on the third insulator plate 116. The third patterned metal layer 126 may be formed in different sections as shown. The third patterned metal layer 126 may thus be formed from a plurality of patterned structures to accommodate a bus bar assembly, disposed thereupon.

As shown in FIG. 1A and FIG. 1B, the semiconductor device package 100 may also include a busbar assembly, connected to the third patterned metal layer 126, in various different sections. The busbar assembly is shown as busbar 140, where the busbar 140 may be formed of a relatively thicker metal, such as copper, and may extend above the plane of the baseplate 101, as shown.

Notably, while the first insulator plate 112 and second insulator plate 114 may be made from a first material, such as silicon nitride, the third insulator plate 116 may be made from a second material, such as aluminum nitride or aluminum oxide. Additionally, according to various embodiments, the thickness of the third insulator plate 116 may differ from that of the first insulator plate 112 and second insulator plate 114. For example, the third insulator plate 116 may be formed of a thicker insulation material than the first and second insulator plate. Choice of the material and thickness for third insulator plate 116 may take into consideration the process for attaching the busbar 140 to the third patterned metal layer 126 on the third insulator plate 116. A more aggressive attachment process, such as ultrasonic welding, may call for a relatively greater thickness and a relatively tougher material for the third insulator plate 116.

The semiconductor device package 100 may further include a first set of electrical connectors, shown as connectors 128, electrically connecting the third patterned metal layer 126 to the first patterned metal layer 122 and a second set of connectors, shown as connectors 129, electrically connecting the third patterned metal layer 126 to the second patterned metal layer 124. As such, the semiconductor device package 100 provides an assembly to electrically and thermally manage a set of semiconductor die, where the semiconductor die are supported on a pair of insulating substrates, separated from a third substrate that supports a busbar. Advantageously, this arrangement facilitates the ability to tailor insulator substrate regions for semiconductor die thermal management, from regions where a busbar is to electrically couple to the semiconductor die, as detailed below.

Turning in particular to FIG. 1B, as shown in the perspective view, the busbar 140, having a relatively greater thickness than the connectors 128 and connectors 129, may better be attached to the third patterned metal layer 126 by ultrasonic welding or other welding process that provides a more robust connection than is needed for the connectors 128 and connectors 129, without damaging the substrate ceramics (such as third insulator plate 116). At the same time the substrate ceramics (see first insulator plate 112 and second insulator plate 114) can be chosen independently so that they provide the optimal characteristics for electrical isolation and high thermal conductivity as needed for the power semiconductor chip sets. As an example, the connectors 128 may be attached to first patterned metal layer 122 and third patterned metal layer 126 by a soldering process. the connectors 129 may likewise be attached to second patterned metal layer 124 and third patterned metal layer 126 by a soldering process. Because the busbar 140 is attached to third substrate 106, not to substrates that include the semiconductor die, such as first substrate 102 or second substrate 104, multiple advantages are provided in the arrangement of FIG. 1A and FIG. 1B. In addition to the flexibility to choose a more robust attachment process since the third insulator plate 116 may be made form a tougher and thicker material than for first insulator plate 112 and second insulator plate 114, the architecture allows the attachment process for the busbar 140 to avoid disturbing or damaging the less tough, thinner substrates, meaning first substrate 102 and second substrate 104.

Turning now to Table I, there is shown an exemplary set of operations for assembling a semiconductor device package, according to some embodiments of the disclosure. As shown the semiconductor die may be subject to a set of testing before assembly. In a DCB operation, a pair of sheets of copper may be affixed to a ceramic substrate, such as aluminum oxide, aluminum nitride or silicon nitride. The sheets may be patterned as suitable to form patterned metal layers for semiconductor die substrates, meaning substrates to support the semiconductor die. Separately, copper sheets may be attached to a "busbar substrate" to be used to support a busbar, separate from the semiconductor die substrates. Notably, the ceramic of the busbar substrate may differ in thickness as well as material, from the semiconductor die substrates, as discussed above. Separately, busbars may be stamped, shaped, and annealed to a predetermined shape.

During assembly, according to the present embodiments, semiconductor die substrates may be assembled separately from the busbar substrates. The semiconductor die (chips) may be soldered to respective semiconductor die substrates according to known techniques. In accordance with the present embodiments, the semiconductor die substrates may be selected to be of an insulator material of thickness and material optimized for electrical isolation and thermal conductivity, as discussed above. X-ray analysis may be performed to test for defects, followed by wire bonding to terminals of the semiconductor die, and electrical testing of the circuitry after the semiconductor die are affixed and wired to the semiconductor die substrates (such as first substrate 102 and second substrate 104, described above).

To assemble a busbar substrate, ultrasonic welding may be used to attach the busbar to a patterned metal layer that is affixed to an insulator plate, such as aluminum oxide or aluminum nitride. As discussed above, the insulator plate for the busbar substrate may be formed of a tougher material, and may be thicker than the semiconductor die substrates. As such, the ultrasonic welding operation may be performed with a high yield due to the greater robustness of the busbar substrate.

Advantageously, according to some embodiments, the ultrasonic welding for busbar attachment may be carried out separate from the module assembly, remote from the semiconductor chips, thus preventing particle contamination of the semiconductor chips during this welding process, and enabling an inspection or test of the busbar attachment outside of the module.

To complete assembly, the various semiconductor substrates as well as busbar substrate are affixed to a baseplate, such as by soldering. The arrangement of the various substrates may be as shown in FIG. 1A, where the busbar substrate (third substrate 106) is disposed between opposing semiconductor die substrates (first substrate 102 and second substrate 104).

Next, electrical connectors (clips) (see connectors 128 and connectors 129) might be soldered between the semiconductor substrates and the busbar substrate. In particular, the connectors are soldered to patterned metal layers provided on the respective semiconductor substrates (see first substrate 102 and second substrate 104). The soldering operation establishes the electrical connection between the semiconductor chips disposed on the semiconductor die substrates and components that are external to the semiconductor device package, via the patterned metal layer on the busbar substrate, and the busbar, already welded to the patterned metal layer.

Alternatively, in further embodiments, these connections of semiconductor substrates and busbar substrate may be created by wire bonding or other means, where ultrasonic bonding of the busbars takes place lastly. In these further embodiments, the material of the semiconductor substrates may still be different from that of the busbar substrate, providing a more flexible approach.

Subsequently, assembly may take place according to known operations, including gluing a plastic cover to the baseplate, filling with gel, adding plastic inserts and screws, and performing final testing.

TABLE I

| Components | |
|---|---|
| Chip | Diffusion processes, testing, dicing |
| DCB | Either: bonding 2 Cu sheets to ceramic (Al2O3, AlN or pattern by etching: cutting into size or: Braze Cu to ceramic |
| Busbars | Stamping Annealing for softness |
| Assembly process | |
| Substrate | Soldering chips to substrate Xray analysis for solder voids Wire bond gate and power connections Electrical testing Ultrasonic welding of busbar to busbar substrate (outside of module) |
| Module | Solder substrates (for chips and for busbar) to baseplate Solder clips for inter-substrate connections glue plastic cover to baseplate fill with gel add plastic inserts and screws final test, PD test |

Figure 2:
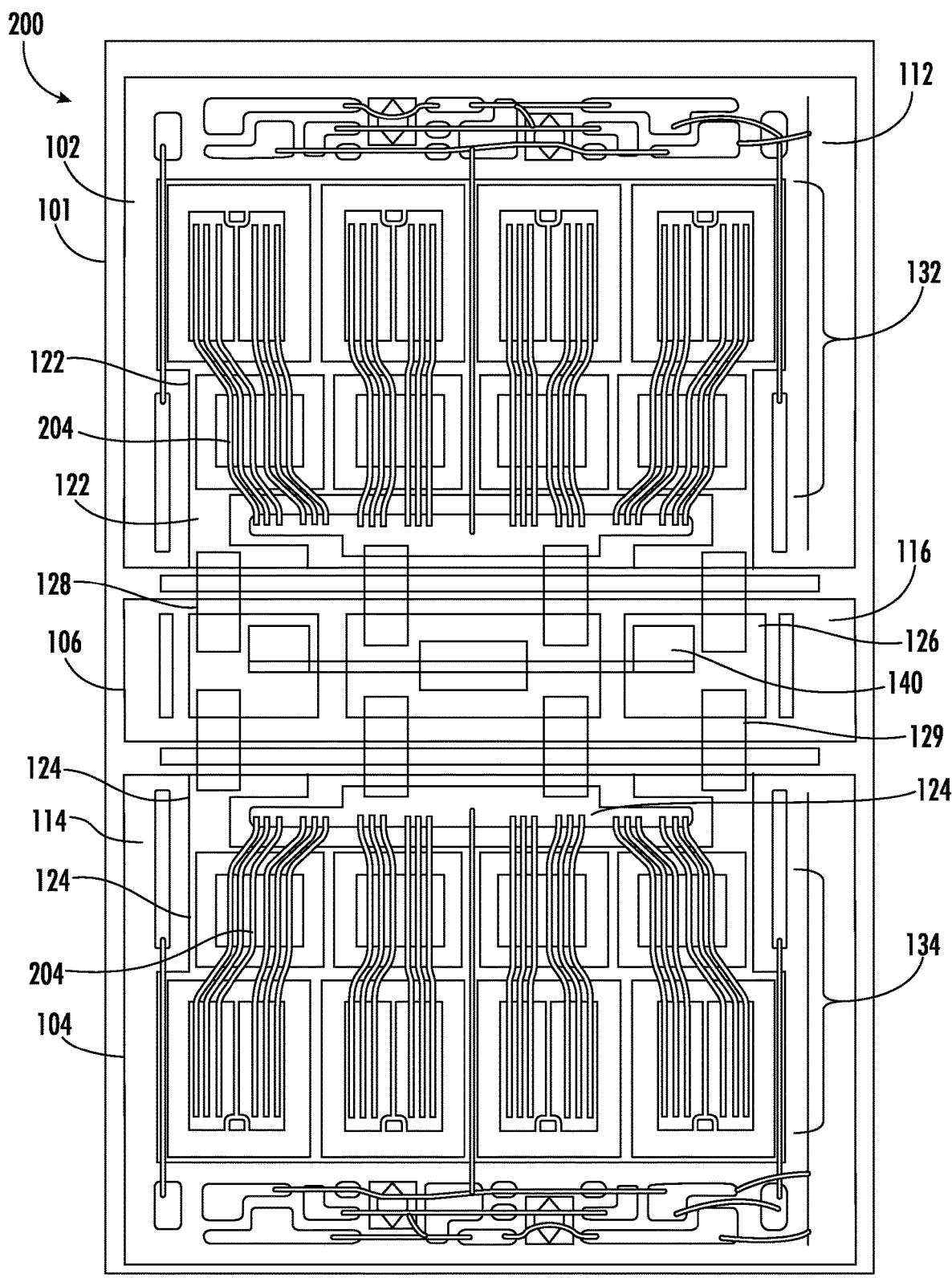
FIG. 2 shows a variant of the embodiment of FIG. 1A, in accordance with some embodiments of the disclosure.

Turning to FIG. 2, there is a shown a top plan view of a variant of the semiconductor device package 100, shown as semiconductor device package 200. In this case, the semiconductor device package 200 may include the aforementioned components of semiconductor device package 100, where like components are labeled the same. Notably, wiring 204 is shown to illustrate exemplary wire patterns to connect the semiconductor die 132 to the first patterned metal layer 122, and to connect the semiconductor die 134 to the second patterned metal layer 124.

Figure 3A:
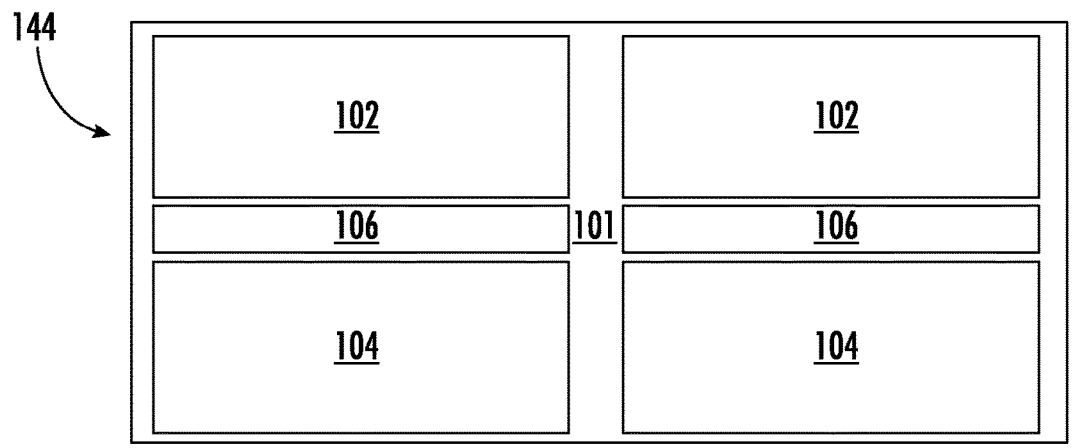
FIG. 3A shows at top plan view of a semiconductor device package architecture, according to embodiments of the disclosure.

While the aforementioned embodiments have depicted semiconductor device packages having two opposing semiconductor die substrates, in other embodiments, a semiconductor device package may include four semiconductor die substrates, six semiconductor die substrates, and so forth. In these additional embodiments, a busbar substrate is provided separately between opposing semiconductor substrates, to support a busbar that is welded directly just to the busbar substrate, as disclosed above. FIG. 3A depicts one such embodiment, where the semiconductor device package 144 includes two pairs of semiconductor die substrates, each separated by a busbar substrate (shown as third substrate 106), all substrates affixed to the baseplate 101, where the substrates shown have been described hereinabove.

Figure 3B:
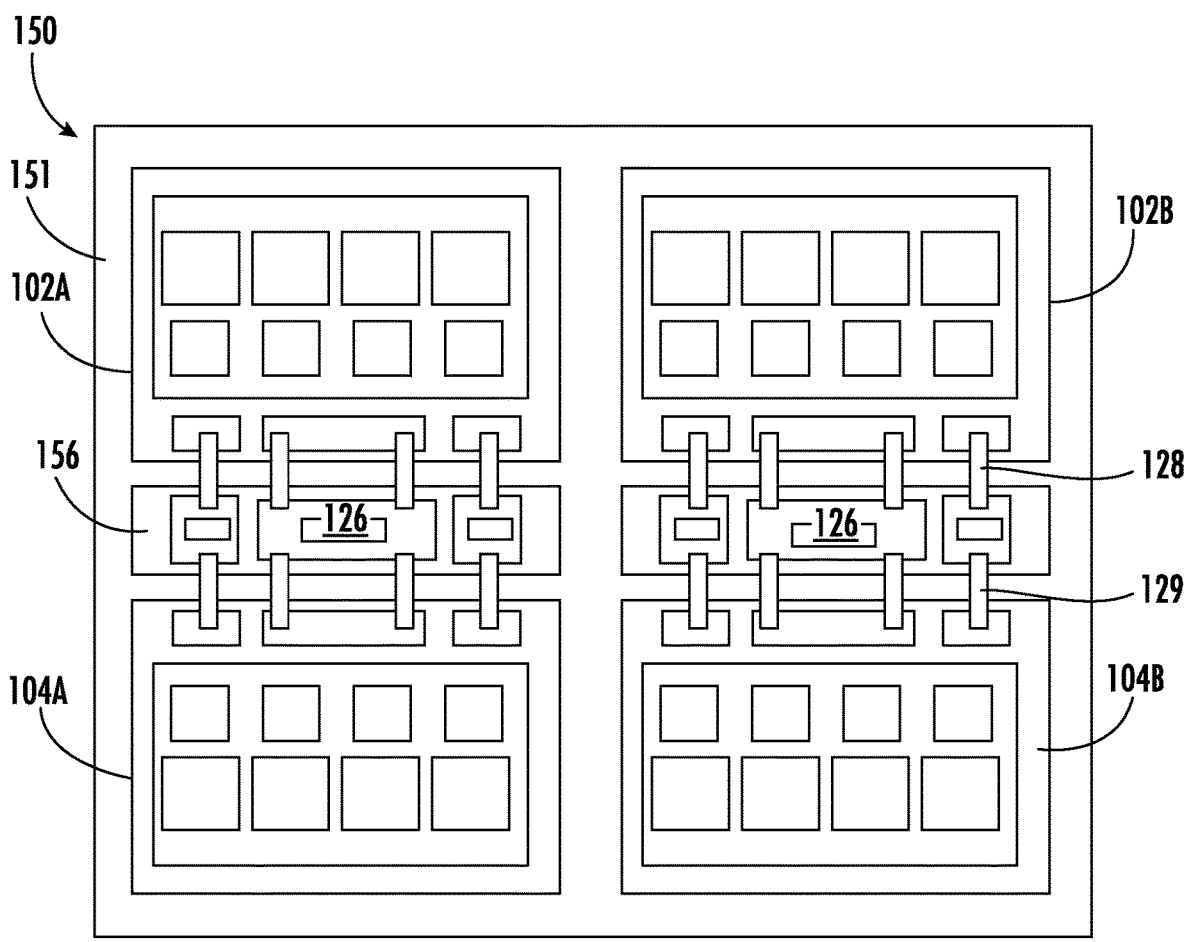
FIG. 3B shows at top plan view of another semiconductor device package, according to other embodiments of the disclosure.

In another embodiment of the disclosure, multiple pairs of substrates may be coupled to one central substrate, holding the busbars. FIG. 3B depicts a semiconductor device substrate assembly 150, according the additional embodiments of the disclosure, where pairs of substrates containing semiconductor power chips are connected to a central busbar substrate 156. The substrate 102A and substrate 102B, disposed on one side of the central busbar substrate 156, may be substantially the same as first substrate 102, described above. The substrate 104A and substrate 104B, disposed on a second side of the central busbar substrate 156, may be substantially the same as second substrate 104, described above, and may be the same as substrate 102A and substrate 104A in some embodiments. In this configuration, the number of components is reduced, for a given number of substrates and given number of semiconductor chips, and the use of interconnects between separate busbar substrates can be avoided. In particular, the gate connections can be run on the central busbar substrate 156, as well as emitter and collector sense connections. This configuration avoids any necessity for wire bonding after soldering, thus enabling the busbar welding prior to the soldering of the substrates to the baseplate.

According to additional embodiments of the disclosure, the patterned metal layer thickness (such as a copper layer thickness) provided on the semiconductor chip substrates may differ from the patterned metal layer thickness provided on a busbar substrate. Notably, the use of a relatively thicker Cu may be advantageous for busbar attachment, while increasing the difficulty in patterning fine patterns in the patterned metal layer structures on the semiconductor chip substrates.

Figure 4:
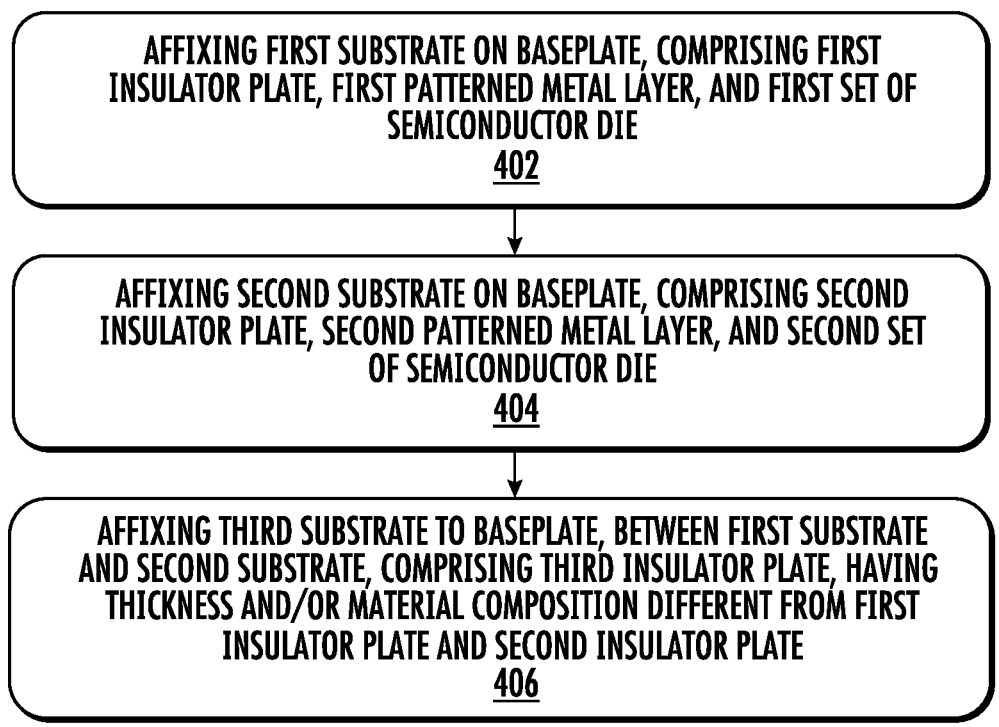
FIG. 4 depicts a process flow, according to embodiments of the disclosure.

Alternatively, adding Cu thickness below the semiconductor chips may add to better thermal performance and lateral conductivity, while maintaining the Cu thickness underneath the busbars allows the welding parameters to be maintained the same. In either case, the separating of busbar substrates from semiconductor substrates allows the patterned copper metal layer thickness to be chosen independently so that other aspects of the substrate device assembly can be optimized. FIG. 4 depicts a process flow 400, according to embodiments of the disclosure. At block 402, a first substrate is affixed to a baseplate, where the first substrate includes a first insulator plate, a first patterned metal layer, disposed on the first insulator plate, and a first set of semiconductor die, disposed on the first patterned metal layer.

At block 404, a second substrate, separate from the first substrate, is affixed to the baseplate, where the second substrate includes a second insulator plate, a second patterned metal layer, disposed on the second insulator plate, and a second set of semiconductor die, disposed on the second patterned metal layer. In various embodiments, the first substrate may be similar to or the same type of substrate as the second substrate. As an example, the first insulator plate and second insulator plate may be the same size, and may be formed of the same material. The first patterned metal layer may have the same shape and overall size of the first patterned metal layer, may be formed of the same material, and so forth. The first set of semiconductor die may be the same as the second set of semiconductor die in terms of the individual die being the same for each set, the arrangement being the same, and so forth.

At block 406, a third substrate is affixed to the baseplate, between the first substrate and the second substrate, and comprising a third insulator plate. In some embodiments, the third substrate may have a different thickness, different material composition, or both, in comparison the first insulator plate and second insulator plate. In other embodiments, the third insulator plate may have the same thickness as the first insulator plate and second insulator plate. As an example, the first insulator plate and second insulator plate may be formed of a highly thermally conductive, thin electrical insulator, such as silicon nitride, while the third insulator plate is formed of a thicker plate made from aluminum oxide or aluminum nitride. The embodiments are not limited in this context. As such, the assembly of substrates allows forming a busbar directly on the third substrate in a robust welding process, while not perturbing the first and second substrate.

Notably, in different embodiments, the operations of the block 402, 404 and 406 may be performed in any order, and generally the different substrates may be affixed to a baseplate in the same general operation, "at the same time."

In another variant of the process flow, the substrate materials are the same for all substrates. In the process flow, the busbars may be attached to the busbar substrate(s) (third substrate) prior to soldering the substrate to the baseplate.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A method of forming a semiconductor package, comprising:
    affixing a first substrate on a baseplate, the first substrate comprising a first insulator material, and a first patterned metal layer;
    affixing a second substrate on the baseplate, the second substrate comprising the first insulator material and a second patterned metal layer; and
    affixing, between the first substrate and the second substrate, a third substrate on the baseplate, the third substrate comprising a second insulator material different from the first insulator material, and further comprising a third patterned metal layer.

2. The method of claim 1, further comprising:
    affixing a first plurality of semiconductor chips on the first patterned metal layer; and
    affixing a second plurality of semiconductor chips on the second patterned metal layer.

3. The method of claim 1, further comprising connecting a busbar to the third patterned metal layer.

4. The method of claim 3, wherein the connecting a busbar to the third patterned metal layer comprises welding the busbar to the third patterned metal layer before the affixing the third substrate to the baseplate.

5. The method of claim 3, wherein the connecting a busbar to the third patterned metal layer comprises ultrasonic welding the busbar to the third patterned metal layer.

6. The method of claim 1, wherein the first substrate comprises a first thickness, and wherein the second substrate comprises the first thickness.

7. The method of claim 6, wherein the third substrate comprises a second thickness, different from the first thickness.

8. The method of claim 7, wherein the second thickness is greater than the first thickness.

9. The method of claim 1, wherein the first substrate and the second substrate comprise a first thermal conductivity, and the third substrate comprises a second thermal conductivity, less than the first thermal conductivity.

10. The method of claim 1, the first insulator material comprising silicon nitride or aluminum nitride, and the second insulator material comprising aluminum nitride or aluminum oxide.

11. The method of claim 1, wherein the first patterned metal layer and the second patterned metal layer comprise a first layer thickness, and wherein the third patterned metal layer comprises a second layer thickness, different from the first layer thickness.

12. The method of claim 1, further comprising:
    affixing a fourth substrate to the baseplate, adjacent the first substrate, on a first side of the third substrate; and
    affixing a fifth substrate to the baseplate, adjacent the second substrate, on a second side of the third substrate.

13. The method of claim 3, further comprising:
    electrically connecting the third patterned metal layer to the first patterned metal layer using a first set of connectors; and
    electrically connecting the third patterned metal layer to the second patterned metal layer using a second set of connectors.

14. The method of claim 2, wherein the first plurality of semiconductor chips and the second plurality of semiconductor chips comprise a set of power semiconductor devices.

15. The method of claim 1, wherein the affixing the first substrate, the second substrate, and the third substrate on the base plate is performed by soldering.

16. The method of claim 1, the third substrate having mechanical properties that are more robust against a mechanical stress during the connecting the busbar to the third patterned metal layer.

* * * * *